US011269397B2

(12) United States Patent
Rowley et al.

(10) Patent No.: US 11,269,397 B2
(45) Date of Patent: *Mar. 8, 2022

(54) POWER CONFIGURATION COMPONENT INCLUDING SELECTABLE CONFIGURATION PROFILES CORRESPONDING TO OPERATING POWER CHARACTERISTICS OF THE POWER CONFIGURATION COMPONENT

(71) Applicant: Micron Technology, Inc., Boise, ID (US)

(72) Inventors: Matthew D. Rowley, Boise, ID (US); Adam J. Hieb, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/996,256

(22) Filed: Aug. 18, 2020

(65) Prior Publication Data

US 2020/0401202 A1 Dec. 24, 2020

Related U.S. Application Data

(63) Continuation of application No. 16/059,387, filed on Aug. 9, 2018, now Pat. No. 10,761,588.

(51) Int. Cl.
G06F 1/26 (2006.01)
G06F 1/32 (2019.01)
G06F 1/3234 (2019.01)
G06F 9/445 (2018.01)
G06F 1/3296 (2019.01)

(52) U.S. Cl.
CPC ............ G06F 1/325 (2013.01); G06F 1/3296 (2013.01); G06F 9/44505 (2013.01)

(58) Field of Classification Search
CPC ...... G06F 1/325; G06F 1/3209; G06F 1/3243; G06F 1/3296; G06F 9/44505; Y02D 10/00

See application file for complete search history.

(56) References Cited

U.S. PATENT DOCUMENTS

| 5,825,697 | A | 10/1998 | Gilliam |
| 7,072,779 | B2 | 7/2006 | Hancock et al. |
| 9,195,293 | B1 | 11/2015 | Quillen et al. |
| 9,984,762 | B1 | 5/2018 | Seshasayee et al. |
| 2009/0006877 | A1 | 1/2009 | Lubbers et al. |
| 2010/0211808 | A1 | 8/2010 | Jeong et al. |
| 2010/0318824 | A1 | 12/2010 | Tinker |
| 2011/0022826 | A1 | 1/2011 | More |

(Continued)

FOREIGN PATENT DOCUMENTS

JP 2018-118443 A 8/2018
KR 10-1824182 B1 1/2018

OTHER PUBLICATIONS

International Search Report and Written Opinion from related international application No. PCT/US2019/044672, dated Nov. 14, 2019, 12 pages.

Primary Examiner — Nitin C Patel
(74) Attorney, Agent, or Firm — Brooks, Cameron & Huebsch, PLLC

(57) ABSTRACT

A power management system includes a memory component storing a plurality of configuration profiles. A plurality of configuration pins are operatively coupled to the memory component. One or more of the plurality of configuration pins receive one or more signals to selectively activate one of the plurality of configuration profiles.

20 Claims, 4 Drawing Sheets

(56) References Cited

U.S. PATENT DOCUMENTS

2014/0173242 A1 6/2014 Huffman et al.
2017/0139699 A1 5/2017 Brown
2018/0210539 A1 7/2018 Hashimoto

POWER CONFIGURATION COMPONENT INCLUDING SELECTABLE CONFIGURATION PROFILES CORRESPONDING TO OPERATING POWER CHARACTERISTICS OF THE POWER CONFIGURATION COMPONENT

PRIORITY INFORMATION

This application is a Continuation of U.S. application Ser. No. 16/059,387, filed Aug. 9, 2018, which issued on Sep. 1, 2020 as U.S. Pat. No. 10,761,588, the contents of which are incorporated herein by reference.

TECHNICAL FIELD

Embodiments of the disclosure relate generally to memory sub-systems, and more specifically, relate to a power configuration component including selectable configuration profiles.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
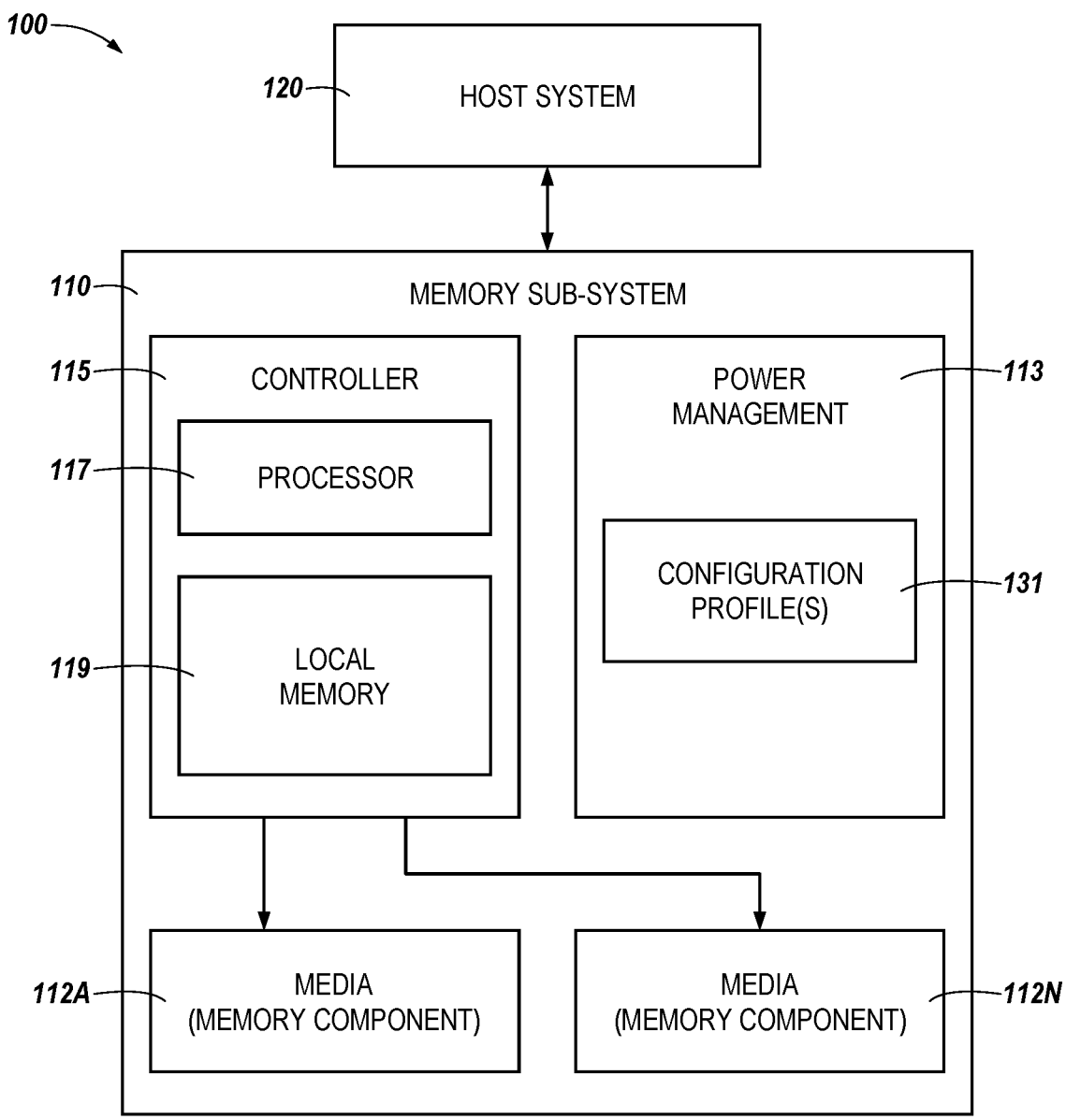
FIG. 1 illustrates an example computing environment that includes a memory sub-system in accordance with some embodiments of the present disclosure.

Aspects of the present disclosure are directed to a power configuration component including selectable configuration profiles. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

Memory sub-systems (e.g., SSDs) can include a power management component such as a power management integrated circuit (PMIC), which can be used to manage various power requirements of the memory sub-system and/or electronic devices coupled thereto.

Some conventional power management components can include etched or hard-coded logic to provide control over the various requirements of the memory sub-system. In approaches that utilize etched or hard-coded logic, the power management component can be configured to provide control over the various requirements of a particular memory sub-system. As a result, such conventional power management components can only be used for a particular application and/or for a particular memory sub-system. If the requirements of the memory sub-system change, for example, such conventional power management components can cease to function or operate properly, which can result in stockpiles of conventional power management components becoming obsolete and therefore non-fungible.

In order to reduce wasted stockpiles of power management components that are etched or include hard-coded logic, some conventional power management components employ eFuses, which can allow for aspects of the power management component to be changed after manufacture. In power management components that employ eFuses, if a particular power management component is no longer used or needed, for example due to changes in various requirements of a memory sub-system for which the power management component is designed, one or more of the eFuses may be burned (e.g., blown). This may allow for the power management component to be reprogrammed to a certain extent to function with a memory sub-system that has had its various requirements changed after manufacture of the power management component. However, due to the nature of eFuses (e.g., the fact that once an eFuses has been blown it cannot be blown again), conventional power management components that utilize eFuses can only be reprogrammed a finite amount of times.

Further, conventional power management components that use eFuses are often programmed (e.g., the eFuses are blown) after manufacture and prior to a point of sale to operate in accordance with a particular set of memory sub-system requirements. If the memory sub-system requirements change after the eFuses are blown, the power management component can generally not be reprogrammed, which can result in stockpiles of conventional power management components becoming obsolete and therefore non-fungible. Accordingly, similar to conventional approaches in which power management components are etched or hard-coded, conventional approaches to power management components that utilize eFuses can lead to wasted stockpiles of power management components. For example, because of the single use nature of eFuses, when the requirements of a memory sub-system for which the power management component is designed change, power management components that utilize eFuses can become non-fungible.

In contrast, aspects of the present disclosure address the above and other deficiencies by allowing for a power management component to store multiple configuration profiles that can be dynamically selected based on the requirements of the memory sub-system and/or host system multiple times. In some embodiments, a particular configuration profile of the PMIC can be selected based on information received from a host system coupled to the memory sub-system. Non-limiting examples of system power requirements can include operating voltages, power mode (e.g., sleep mode) sequencing, master/slave configurations, serial ATA (SATA) input voltages, peripheral interconnect express (PCIe) input voltages, power backup operations, timing characteristics, operational characteristics, etc., which can be controlled based on the configuration profile that is provided by the PMIC. As used herein, a "configuration profile" generally refers to a protocol, set of operating voltages, master/salve configuration, power backup state, specification, or other information corresponding to operation of a host system or computer component such as an SSD, video card, audio card, or other computer component. For example, aspects of the present disclosure include a power management component (e.g., PMIC) having non-volatile memory (NVM) disposed thereon.

The present disclosure describes that memory of the PMIC can be configured to store multiple configuration profiles that can correspond to multiple different system requirements for memory sub-systems. For example, there can be a configuration profile for a memory sub-system configured for an enterprise computing environment and there can be a different profile for a memory sub-system configured for a client or consumer computing environment.

For example, since memory sub-systems such as SSDs can be configured for different computing environments (e.g., enterprise computing environment, client or consumer computing environment, mobile computing environment, etc.), it can be beneficial to provide the ability to selectively enable one of multiple configuration profiles in order to accommodate systems requirements for a particular computing environment. Selective activation of the configuration profile can further include enabling the configuration profile such that operating characteristics corresponding to the configuration profile operate within one or more computing environments of a memory sub-system coupled to the PMIC.

In some embodiments, the power management component can include one or more power management configuration pins that can receive selection signals to selectively enable particular power configuration profiles stored in the memory of the power management component.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such. In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. Each of the memory cells can store one or more bits of data (e.g., data blocks) used by the host system 120. Although non-volatile memory components such as NAND type flash memory are described, the memory components 112A to 112N can be based on various other types of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processing device (e.g., processor 117) configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. For instance, the memory components 112A to 112N can include control circuitry, address circuitry (e.g., row and column decode circuitry), and/or input/output (I/O) circuitry by which they can communicate with controller 115 and/or host 120. As an example, in some embodiments, the address circuitry (can receive an address from the controller 115 and decode the address to access the memory components 112A to 112N.

The memory sub-system 110 includes a power management component 113 (e.g., a PMIC) that can be configured to access multiple configuration profiles that correspond to different operating characteristics of the power management component 113. In some embodiments, the configuration profiles are stored in memory of the power management component 113, as described in greater detail below in conjunction with FIG. 2. In some embodiments, the configuration profiles are stored in memory (e.g., memory of the memory sub-system 110) that is coupled to the power management component 113. As described in more detail in connection with FIG. 2 and FIG. 3, herein, the power management component 113 can include configuration pins and a memory (e.g., a NVM), which can include one or more memory locations (e.g., one or more registers, one or more one-time programmable memories, etc.). Although not explicitly shown in FIG. 1, in some embodiments, the controller 115 includes at least a portion of the power management component 113. For example, the controller 115 can include a processor 117 (processing device) configured to execute instructions stored in local memory 119 for performing the operations described herein. In some embodiments, the power management component 113 is part of the host system 120, an application, or an operating system.

The power management component 113 can receive selection signals to select (e.g., enable) one of a number of (e.g., multiple) configuration profiles stored thereon. In some embodiments, the power management component 113 can receive the selection signals from the host system 120 and/or from the controller 115. The configuration profiles can correspond to different operating characteristics corresponding to the memory sub-system 110 and/or host system 120. For example, one configuration profile stored by the power management component 113 can correspond to a particular set of operating characteristics of the memory sub-system 110, while a different configuration profile stored by the power management component 113 can correspond to a different set of operating characteristics of the memory sub-system 110. Further details with regards to the operations of the power management component 113 are described below.

In some embodiments, the memory of the PMIC can include a one-time programmable (OTP) memory; however, embodiments are not limited to a particular type of memory local to the PMIC. For instance, the memory of the PMIC can be flash memory, programmable read only memory (PROM), erasable programmable read only memory (EPROM), electrically erasable programmable read only memory (EEPROM), and/or phase-change memory (PCM), among others.

Figure 2:
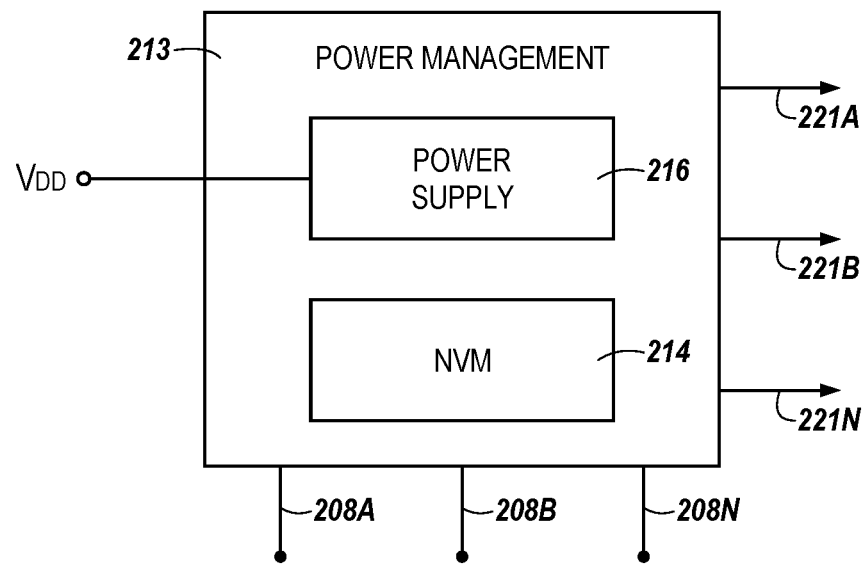
FIG. 2 illustrates an example of a power management component in accordance with some embodiments of the present disclosure.

FIG. 2 illustrates an example of a power management component 213 in accordance with some embodiments of the present disclosure. The power management component 213 can include a non-volatile memory (NVM) 214, a power supply 216, and/or configuration pins 208A to 208N.

The NVM 214 can store configuration profiles. The configuration profiles can include protocols, sets of operating voltages, master/salve configurations, power backup state, specifications, or other information corresponding to operation of a host system or computer component such as an SSD. In some embodiments, the configuration profiles can include power management specifications, which can manage power consumed by the host system and/or computer component. Other non-limiting examples of configuration profiles can include profiles that include power mode (e.g., sleep mode) sequencing, master/slave configurations, serial ATA (SATA) input voltages, peripheral interconnect express (PCIe) input voltages, power backup operations, timing characteristics, operational characteristics, etc., which can be controlled based on the configuration profile that is selected for use by the PMIC.

The configuration profiles can be stored in various formats as prescribed by the standards (e.g., standards prescribed by the peripheral component interconnect special interest group) to which they correspond. For example, configuration profiles corresponding to PCIe configurations can be stored in a management data input/output (MDIO) data format. Examples ore not so limited, however, and the configuration profiles can be stored in any data format that allows the configuration profile to be accessed by the PMIC and/or host computing device.

The configuration pins 208A to 208N can receive one or more selection signals from a host system (e.g., host system 120 illustrated in FIG. 1, herein), a memory sub-system (e.g., memory sub-system 110 illustrated in FIG. 1, herein), and/or a controller (e.g., controller 115 illustrated in FIG. 1, herein). In the example shown in FIG. 2, the power management component 213 includes 3 configuration pins 208A, 208B, and 208N, which can allow for eight distinct configuration profiles stored by the power management component 213 to be accessed in response to receipt of the selection signals. For example, application of a logical "1" (or physical voltage above a predetermined threshold voltage value) to configuration pin 208A (while configuration pins 208B and 208N have a logical value of "0" applied thereto) can correspond to a particular configuration profile being selected. Similarly, application of a logical "1" to (or physical voltage above a predetermined threshold voltage value) to configuration pin 208 (while configuration pins 208A and 208N have a logical value of "0" or physical voltage below a predetermined value applied thereto) can correspond to a different particular configuration profile being selected. Table 1 summarizes the various configurations that can be accessed using the 3 configuration pins shown in FIG. 2. Although shown as logical "1s" and "0s" in Table 1, embodiments are not so limited, and discrete voltages can be applied to the configuration pins 208A to 208N in the combinations shown in Table 1 to select various configuration profiles.

TABLE 1

| CONFIG. PIN 208A | CONFIG. PIN 208B | CONFIG. PIN 208N | CONFIGURATION PROFILE |
|---|---|---|---|
| 1 | 0 | 0 | 1 |
| 0 | 1 | 0 | 2 |
| 0 | 0 | 1 | 3 |
| 1 | 1 | 0 | 4 |
| 0 | 1 | 1 | 5 |
| 1 | 0 | 1 | 6 |
| 1 | 1 | 1 | 7 |
| 0 | 0 | 0 | 8 |

In some embodiments, each configuration pin 208A to 208N may be configured to access a first configuration profile when a selection signal is applied and a second configuration profile when a selection signal is not applied. Stated alternatively, the number of configuration profiles that can be accessed responsive to selection signals can correspond to $2^M$ where M is the number of configuration pins 208A to 208N included in the power management component 213. Embodiments are not limited to a power management component 213 having three configuration pins, however, and the power management component 213 can include more than three configuration pins or less than three configuration pins in some embodiments.

The configuration pins 208A to 208N can be selectively operated to perform a bootstrapping operation on the power management component 213. A bootstrapping operation can include an operation that is performed without an external output. For example, a bootstrapping operation can be performed in response to a power-up or reset operation without an additional command. Accordingly, in some embodiments, the configuration pins 208A to 208N can be selectively operated to select the desired configuration in response to a power-up or reset event without an additional command.

The selection signals can cause the configuration pins 208A to 208N to be selectively activated to perform a bootstrapping operation to select the desired configuration profile stored by the power management component 213. For example, the configuration pins 208A to 208N can be selectively activated to cause a configuration profile corresponding to characteristics of the host system or memory sub-system to be enabled. In some embodiments, the configuration pins 208A to 208N can be selectively operated by selection signals generated by a host system, memory sub-system, and/or a controller.

The selection signals can be binary in nature. For example, the selection signals can correspond to a high value (e.g., a value corresponding to a logical "1") or a low value (e.g., a value corresponding to a logical "0."). Embodiments are not so limited, however, and the selection signals can have other non-binary values associated therewith. For example, the selection signals may have one or more non-zero voltages (e.g., 3.3 volts, 5 volts, 12 volts, etc.) and/or ground reference potential (e.g., zero volts) voltages corresponding thereto, and the magnitude of the voltage signal applied as a selection signal can cause activation of the configuration pins 208A to 208N.

In some embodiments, the configuration pins 208A to 208N can be physically coupled to one or more portions of a memory sub-system (e.g., memory sub-system 110 illustrated in FIG. 1). For example, one or more of the configuration pins 208A to 208N can be physically coupled (e.g., hardwired) to a voltage signal and/or a ground reference potential to cause selective activation of a configuration profile stored by the power management component 213. By choosing which configuration pins among the configuration pins 208A to 208N are coupled to the voltage signal and the ground reference potential, a particular configuration profile can be selectively activated.

In embodiments in which the configuration profile is selectively activated based on which configuration pins 208A to 208N are physically coupled to one or more portions of the memory sub-system, the configuration pins that are physically coupled to the one or more portions of the memory sub-system can be configured such that they are coupled to particular portions of the NVM 214 when the power management component 213 is coupled to the memory sub-system. For example, configuration pin 208A can be coupled to a particular memory location of the NVM such as memory location 331A illustrated in FIG. 3, while a different configuration pin (e.g., configuration pin 208N can be coupled to a different memory location of the NVM such as memory location 331N illustrated in FIG. 3. Embodiments are not so limited; however, and the configuration pins 208A to 208N can be configured in any configuration in which a configuration profile can be selectively activated when the configuration pins 208A to 208N are physically coupled to one or more portions of the memory sub-system.

The NVM 214 (described in more detail in connection with FIG. 3, herein) can store multiple configuration profiles, which can be selectively activated based on the selection signals received by the configuration pins 208A to 208N. In some embodiments, the NVM 214 can be a one-time programmable (OTP) memory component, however, embodiments are not so limited.

The power management component 213 can further include one or more output signal paths 221A to 221N. The output signal paths 221A to 221N can be configured to pass control signals externally from the power management component 213 to a memory sub-system, such as memory sub-system 110 illustrated in FIG. 1, herein. The control signals can include voltage signals, control logic, timing signals, and/or other control signals that correspond to particular configuration profiles. For example, the control signals can include operating voltage signals corresponding to operation of a particular memory sub-system, particular timing signals corresponding to operation of the memory sub-system, sleep state signals corresponding to operation of the memory sub-system, master/slave configuration signals corresponding to operation of the memory sub-system, specification signals corresponding to operation of the memory sub-system, and/or other signals that cause the memory-subsystem to operate at particular system power parameters according to the configuration profile selectively activated by the power management component 213.

The output signal paths 221A to 221N can be coupled to one or more components of a memory sub-system (e.g., memory sub-system 110 illustrated in FIG. 1) and/or a host system (e.g., host system 120 illustrated in FIG. 1). For example, the output signal paths 221A to 221N can comprise communication links (e.g., wires, data paths, etc.) that are communicatively coupled to the memory sub-system. The control signals passed via the output signal paths 221A to 221N can have different voltages, signal strengths, etc. corresponding thereto. For example, a magnitude of a voltage signal passed via output signal path 221A can have a different magnitude than a voltage passed via output signal path 221B. The control signals can comprise regulated signals to provide power or other configuration information to one or more components of the memory sub-system. For example, the control signals can provide power (e.g., an operating voltage) or other configuration information to the memory sub-system according a selected configuration profile.

The power supply 216 can receive a power signal (e.g., $V_{DD}$) to provide an operating voltage to the power management component 213. For example, the power management component 213 can be powered on (e.g., powered-up, initiated, etc.) responsive to receipt of a power signal by the power supply 216. The power signal $V_{DD}$ can be generated by the memory sub-system (e.g., memory sub-system 110 illustrated in FIG. 1) or by electronic devices coupled thereto.

Figure 3:
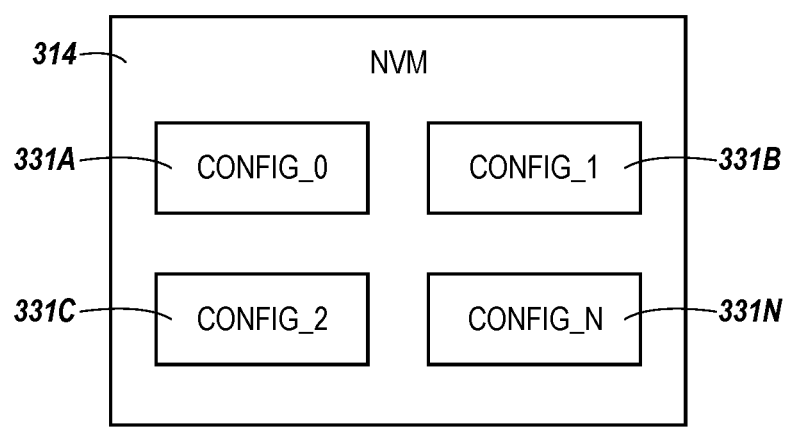
FIG. 3 illustrates an example of a non-volatile memory in accordance with some embodiments of the present disclosure.

FIG. 3 illustrates an example of a non-volatile memory 314 in accordance with some embodiments of the present disclosure. As shown in FIG. 3, the NVM 314 can include memory locations 331A to 331N that can be configured to store one or more configuration profiles CONFIG_0 to CONFIG_N. In some embodiments, each memory location 331A to 331N can be configured to store a particular configuration profile. As a non-limiting example, CONFIG_0 can be a configuration profile corresponding to a peripheral interconnect connect express (PCIe) configuration, CONFIG_1 can be a configuration profile corresponding to a serial ATA (SATA) configuration, CONFIG_2 can be a configuration profile corresponding to master/slave assignments for a host system, and/or CONFIG_N can be configuration profile corresponding to power backup configurations for the host system. The configuration profiles CONFIG_0 to CONFIG_N can correspond to the eight configuration profiles enumerated in Table 1, above.

In some embodiments, the memory locations 331A to 331N of the NVM 314 can be configured into one or more partitions (e.g., subsections). For example, memory location 331A can be configured to include one or more partitions that can each store a configuration profile and/or a lookup table to locate the different configuration profiles stored in NVM 314. Similarly, memory locations 331B to 331N can be partitioned into partitions. The lookup table can be a data structure that is configured to store pointers corresponding to locations in the NVM 314 in which particular configuration profiles are stored. As previously described, the NVM 314 (e.g., the configuration profiles CONFIG_0 to CONFIG_N) can be selectively activated by the configuration pins shown and described in connection with FIG. 2. For example, the configuration profiles stored in the NVM 314 can be accessed through use of the configuration pins described in FIG. 2.

By storing different configuration profiles in separate partitions, some embodiments can allow for improved configuration profile management in comparison with approaches in which all the configuration profiles are stored in a single partition of the NVM 314. Further, in embodiments in which each configuration profile is stored in a separate partition (e.g., memory location 331A to 331N), the desired configuration profile can be selected without the use of a look-up table or other memory management instructions. For example, in some embodiments, the configuration pins (e.g., the configuration pins 208A to 208N shown in FIG. 2, herein) can be coupled to respective memory locations 331A to 331N such that activation of a particular configuration pin (e.g., as shown in Table 1, herein) cause selection of a particular configuration profile based on which partition the particular configuration profile is stored in. Embodiments are not so limited, however, and in some embodiments, a look-up table or other similar data structure can be stored in one or more of the memory locations 331A to 331N to facilitate selection of a particular configuration profile (e.g., CONFIG_0 to CONFIG_N).

In some embodiments, the desired configuration profile can be selectively activated at the board level (e.g., post-manufacture, but prior to the power management component being shipped to an end user). As used herein, the phrase "the board level" can, for example, refer to the circuit board level. For example, at the board level can refer to a scenario in which the configuration profile is selectively activated by enabling the configuration pins directly on the circuit board, as opposed to at a later stage in manufacture. This may allow for a power management component to be manufactured for use in various systems (e.g., host systems, memory sub-systems, SSDs, etc.) that can utilize different configuration profiles. For example, through selective activation of a particular configuration profile, a particular PMIC can be manufactured to fit a certain socket size or die size, regardless of the operating characteristics of various memory sub-systems the PMIC is to be coupled to.

Figure 4:
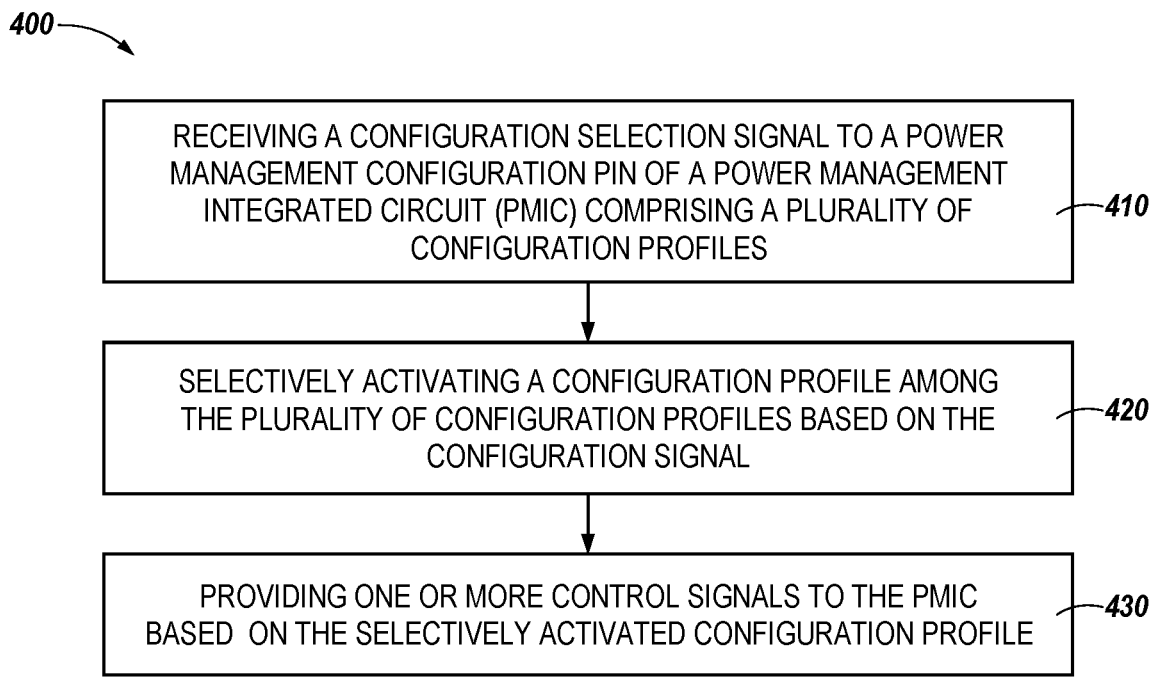
FIG. 4 is a flow diagram of an example method corresponding to a power configuration component including selectable configuration profiles in accordance with some embodiments of the present disclosure.

FIG. 4 is a flow diagram of an example method 400 corresponding to a power configuration component including selectable configuration profiles, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the memory power management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 410, the method 400 can include receiving a configuration selection signal to a power management configuration pin of a power management integrated circuit (PMIC) comprising a plurality of configuration profiles. The PMIC can have configuration profiles stored thereon. As described above, the configuration profiles correspond to respective sets of operating characteristics of the PMIC. The configuration profiles can be stored in a non-volatile memory (NVM) of the PMIC. The NVM can be analogous to NVM 214 illustrated in FIG. 2 and/or NVM 314 illustrated in FIG. 3, herein. For example, the NVM can be a OTP memory device in some embodiments. The PMIC can be analogous to the power management component 113 illustrated in FIG. 1, herein.

At block 420, the method 400 can include selectively activate a configuration profile among the plurality of configuration profiles based on the configuration signal. For example, a configuration selection signal can be received to one or more power management configuration pins of the PMIC to selectively activate one of the configuration profiles. The configuration pin can be analogous to configuration pins 208A to 208N illustrated in FIG. 2, herein. In some embodiments, receipt of the selection signal at the power management pin of the PMIC can further include receiving the selection signal at a particular bootstrap configuration pin among a set of bootstrap configuration pins of the PMIC. As used herein, a bootstrap configuration pin can be a pin that is activated as part of a bootstrap operation, as described above. In some embodiments, selective activation of the configuration profile can further include outputting a voltage signal with a magnitude corresponding to the particular set of operating characteristics from the PMIC.

At block 430, the method 400 can include providing one or more control signals to the PMIC based on the selectively activated configuration profile. The one or more control signals can cause the PMIC to operate according to the particular set of operating characteristics to which the activated one of the configuration profiles corresponds. For example, the processing device can determine that the PMIC is to operate according to a particular set of operating characteristics. In some embodiments, the PMIC can then operate according to a particular set of operating characteristics corresponding to a memory sub-system in which the PMIC will be deployed. Embodiments are not so limited, however, and the particular set of operating characteristics under which the PMIC will operate in practice can be determined prior to the PMIC being shipped or sold to an end user.

In some embodiments, selectively activating the configuration profile to cause the PMIC to operate according to the particular set of operating characteristics can further include causing the PMIC to manage a power consumption (e.g., an amount of power provided to a memory sub-system) of a memory sub-system (e.g., memory sub-system 110 illustrated in FIG. 1, herein) and/or host system (e.g., host system 120 illustrated in FIG. 1, herein). Selectively activating the configuration profile to cause the PMIC to operate according to the particular set of operating characteristics can further include accessing the NVM (e.g., a OTP memory component of the PMIC) to locate the configuration profile, as discussed in connection with FIG. 3, herein. For example, selective activation of the configuration profile can cause the PMIC to locate the configuration profile using a lookup table stored in a memory location (or memory location partition) of the NVM. Embodiments are not so limited, however, and, as described above in connection with FIG. 3, the configuration profile can be selected by accessing a partition of the NVM (e.g., NVM 314 shown in FIG. 3) that stores the desired configuration profile.

Figure 5:
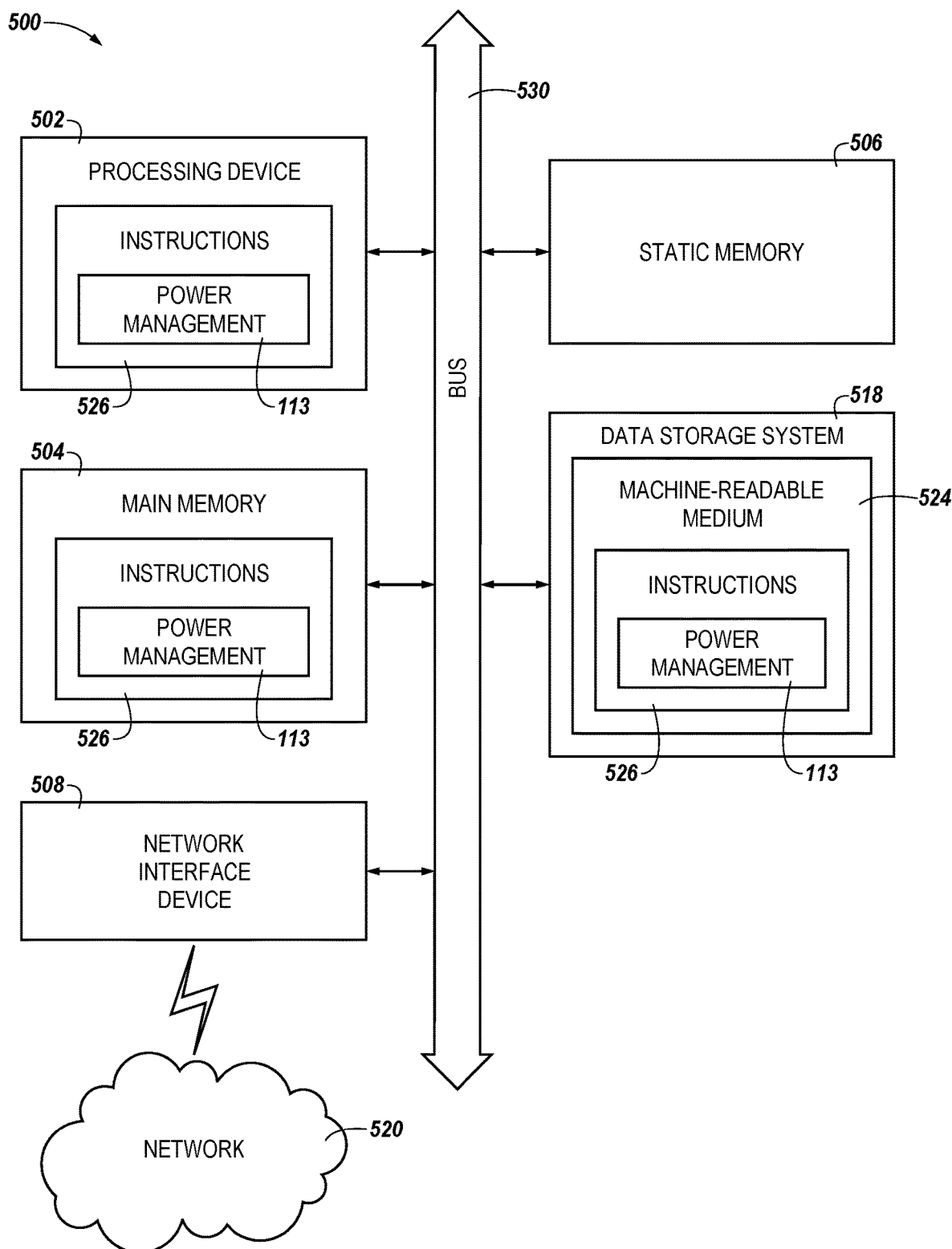
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the power management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 604 can correspond to the memory sub-system 110 of FIG. 1.

In one embodiment, the instructions 526 include instructions to implement functionality corresponding to a power management component (e.g., the power management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:
a power management integrated circuit (PMIC) comprising internal memory and being disposed on solid state memory device, the internal memory configured to store a plurality of configuration profiles; and
configuration pins operatively coupled to the PMIC, wherein one or more of the configuration pins receives a signal to activate at least one of the plurality of configuration profiles, and wherein the activated at least one of the plurality of configuration profiles causes the PMIC to operate according to a particular set of operating characteristics.

2. The apparatus of claim 1, wherein the internal memory comprises a plurality of memory locations, and wherein respective configuration profiles of the plurality of configuration profiles are stored in respective memory locations of the internal memory.

3. The apparatus of claim 1, wherein the activated at least one of the plurality of configuration profiles corresponds to a peripheral component interconnect express (PCIe) configuration profile, a serial AT attachment (SATA) configuration profile, a power backup signal, or a power consumption mode, or any combination thereof.

4. The apparatus of claim 1, wherein the activated at least one of the plurality of configuration profiles corresponds a respective operating voltage, operational characteristic, or timing characteristic, or any combination thereof, than a different one of the configuration profiles.

5. The apparatus of claim 1, wherein the PMIC is configured to receive the signal from a processor associated with the solid state memory device.

6. The apparatus of claim 1, wherein the one or more of the configuration pins receive the signal to activate the at least one of the plurality of configuration profiles in response to a power-up operation.

7. The apparatus of claim 1, wherein the one or more of the configuration pins receive the signal to activate the at least one of the plurality of configuration profiles in response to a reset operation.

8. A method, comprising:
receiving a configuration selection signal to a power management configuration pin of a power management integrated circuit (PMIC) disposed on a solid state memory device, the PMIC comprising an internal memory storing a plurality of configuration profiles; and
activating a configuration profile among the plurality of configuration profiles to cause the PMIC to operate according to a particular set of operating characteristics based on the configuration selection signal.

9. The method of claim 8, wherein receiving the configuration selection signal further comprises receiving the selection signal by a bootstrap configuration pin of the PMIC.

10. The method of claim 8, wherein receiving the selection signal to the power management configuration pin to activate the configuration profile further comprises receiving a control signal corresponding to the particular set of operating characteristics of the PMIC.

11. The method of claim 8, wherein the internal memory is a non-volatile read-only memory in which the configuration profiles are stored.

12. The method of claim 8, wherein causing the PMIC to operate according to the particular set of operating characteristics further comprises managing a power consumption of a memory sub-system.

13. The method of claim 8, wherein receiving the selection signal to the power management configuration pin to selectively activate the configuration profile further comprises accessing a lookup table stored in the internal memory of the PMIC.

14. A system, comprising:
   a power management component disposed on a solid state memory device, the power management component comprising an internal memory storing a plurality of configuration profiles in respective portions of the internal memory; and
   a processor disposed on the solid state memory device and coupled to the power management component, wherein the processor is configured to:
      enable a configuration pin coupled to the power management component; and
      cause, responsive to enablement of the configuration pin, the power management component to operate according to a particular set of operating characteristics corresponding to one of the configuration profiles.

15. The system of claim 14, wherein the processor is to enable an output pin coupled to the power management component to manage a power consumption of a memory sub-system according to the particular set of operating characteristics.

16. The system of claim 14, wherein the processor is to access a data structure stored in a particular one of the respective portions of the internal memory to locate the configuration profile to be selectively activated.

17. The system of claim 14, wherein the processor is to apply a voltage of a particular magnitude to an output pin coupled to the power management component in response to enablement of a configuration profile corresponding to the particular set of operating characteristics.

18. The system of claim 14, wherein the processor is to cause the power management component to operate according to the particular set of operating characteristics in response to a power-up operation.

19. The system of claim 14, wherein the processor is to cause the power management component to operate according to the particular set of operating characteristics in response to a reset operation.

20. The system of claim 14, wherein the processor is to cause performance of a bootstrapping operation as part of selective activation of the configuration profile.

\* \* \* \* \*